United States Patent [19]

Boutin et al.

[11] 4,414,646
[45] Nov. 8, 1983

[54] MAGNETIC BUBBLE MEMORY DEVICES

[75] Inventors: Xavier Boutin, Elancourt; Francis Compagnon, Saint-Gratien; Michel Poirier, Eragny, all of France

[73] Assignee: Societe D'Applications Generales D/Electricite et de Mecanique Sagem, Paris, France

[21] Appl. No.: 249,371

[22] Filed: Mar. 31, 1981

[51] Int. Cl.³ .............................................. G11C 19/08
[52] U.S. Cl. ..................................................... 365/2
[58] Field of Search ............................................ 365/2

[56]       References Cited
       U.S. PATENT DOCUMENTS

| | | | |
|---|---|---|---|
| 3,958,155 | 5/1976 | Bogholtz et al. | 365/2 |
| 4,027,300 | 5/1977 | Braun | 365/2 |
| 4,096,581 | 6/1978 | Carlo et al. | 365/2 |
| 4,308,591 | 12/1981 | George et al. | 365/2 |

Primary Examiner—James W. Moffitt
Attorney, Agent, or Firm—Larson and Taylor

[57] ABSTRACT

A magnetic bubble memory device comprises a common package accommodating a plurality of pairs of memory chips. In each pair, the two chips have bubble propagation patterns in confronting relation which are mirror images of each other and additionally angularly offset by 180. Electrical connecting leads between the chips and the outside of the package are carried by insulating films located between the confronting chips. Coils located in the package create a bias magnetic field which is common to all chips. The coils for driving bubbles along the patterns are also common to all chips.

12 Claims, 10 Drawing Figures

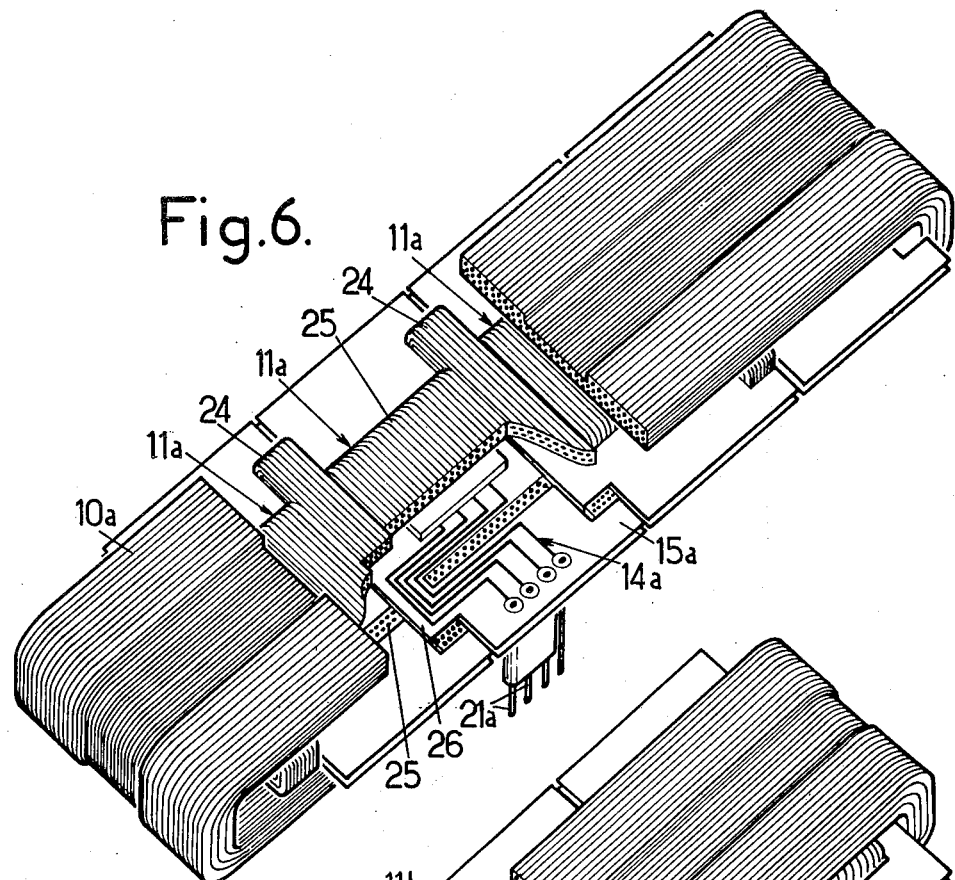
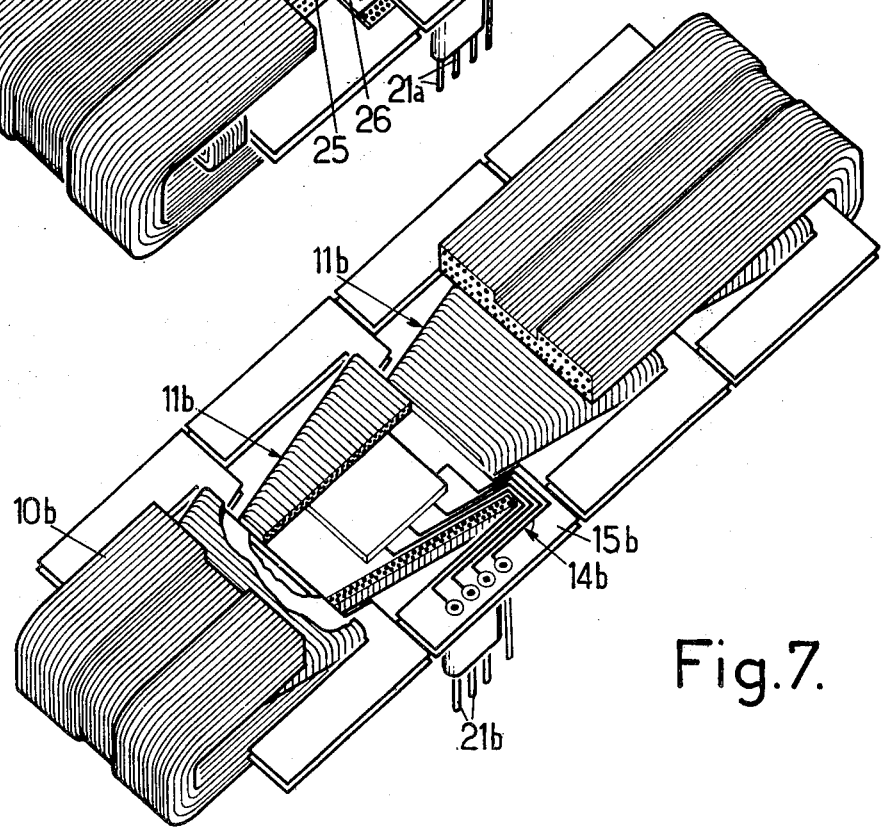

MAGNETIC BUBBLE MEMORY DEVICES

BACKGROUND AND SUMMARY OF THE INVENTION

The present invention relates to magnetic bubble memory devices and particularly, though not exclusively, those devices having drive means of the rotating magnetic field type.

A magnetic bubble memory device comprises a package provided with means for creating a continuous bias field, means for driving the bubbles, means for creating, duplicating, transferring and detecting the bubbles and output connections from these different means. The bubbles are formed by cylindrical zones of small diameter (a few microns) in a thin layer, in which zones the magnetization is in the opposite direction to that of the surrounding zone of the thin layer. The bubbles propagate along paths materialized by juxtaposed patterns of ferro-magnetic material deposited on the surface of the thin layer. The magnetic bias field, whose main component is directed perpendicularly to the thin layer, maintains the bubbles in existence.

Most of the bubble memory devices now available are of the type having rotating field drive means. The rotary field is created in the plane of the chips by two windings disposed perpendicularly to each other and through which flow alternating currents whose frequency determines the speed of propagation. The magnetic layer, a few microns thick, is deposited on a substrate about 0.5 mm thick. The chip is so placed within the windings that the magnetic layer situated on one face of the chip is substantially in the plane of symmetry of the coil windings. Only half of the internal volume of the windings is consequently used to accomodate a chip.

However, it has been suggested to use pairs of mutually facing chips (as described in IEEE Transactions on magnetics, Vol. 10, No. 3, Sept. 1974, pp. 739–745) or a three dimensional stack of magnetic bubble devices (U.S. Pat. No. 3,983,547 to ALMASI) to save space. The proposed arrangements have however proven less than satisfactory, particularly due to problems of field homogeneity, connections between the chips and outside circuit and geometry of the overall device.

It is an object of the invention to provide an improved bubble memory device including a plurality of chips associated with common drive and bias means; it is a more particular object to provide a device having a high data storage capability for a predetermined size and satisfactory performances in operation.

To this end, a magnetic bubble device comprises a common package and at least one pair of separate memory chips located in said package with bubbles propagation patterns in confronting relationship. Means, which may be quite conventional in nature, are provided for creating duplicating, transferring and sensing bubbles. The propagation patterns of the two chips are obtained one from the other by symmetry with respect to a median plane, then angular offset by 180°, and subjected to the same bias field creation means and to the same drive means. A thin sheet of electrically insuling material located in the midplane of the drive means carry electrical connections between the chips and the outside.

In the case of rotary-field drive means, each pair of chips is disposed in a separate coil, which is part of a split coil (generally the internal coil) and all pairs are placed in a common other coil (generally the external coil) crossed with the first coil.

It might be thought that, so as to further increase the capacity of such a memory, it would be sufficient to locate several chips side by side bonded on a same support. In fact, this is not satisfactory for a number of reasons. The lengths of the connecting leads are not the same for all chips. It is not possible to test the chips separately, whereby the whole package should be rejected in the event of a defect of a single chip or its associated elements.

To overcome the difficulty, a memory device according to the invention comprises several pairs of chips which are placed side by side whose connections exit directly through short interruptions in one of the coils and which are subjected to the same bias field creating means: then, the connection lengths can be equal; different chips may be tested separately and only those chips which are defective are not used. It will often be of advantage to locate twice four chips in the same case, so as to store eight-bit bytes. But the number of chips may be increased although, in practice, there is no advantage in exceeding 2×6 chips due to the attendent increase in the electrical reactive power.

The bias field is advantageously slightly inclined with respect to the perpendicular to the layers so as to have a component aligned with the start direction of the rotary field. In practice, an inclination of 1° to 3° will be selected, which leads to a component in the plane of the layers of a few Oersteds (typically 2 to 6 Oe). Since the chip patterns are angularly offset by 180°, the bias field has a suitable orientation for one and the other. Its value will be selected depending on the diameter of the bubbles: it will typically be of from 150 to 200 Oe, whereas the rotary field will generally have a strength of 40 to 50 Oe. By way of example, a value of 150 Oe is generally selected for bubbles of 3 μm and that amplitude should be approximately in inverse proportion to the diameter of the bubbles for a same magnetic layer.

The invention will be better understood from the following description of a particular embodiment, given by way of example only.

SHORT DESCRIPTION OF THE DRAWINGS

FIGS. 6 and 7 are isometric views illustrating modified embodiments of the rotating field creating means;

DETAILED DESCRIPTION OF PARTICULAR EMBODIMENTS

Figure 1:
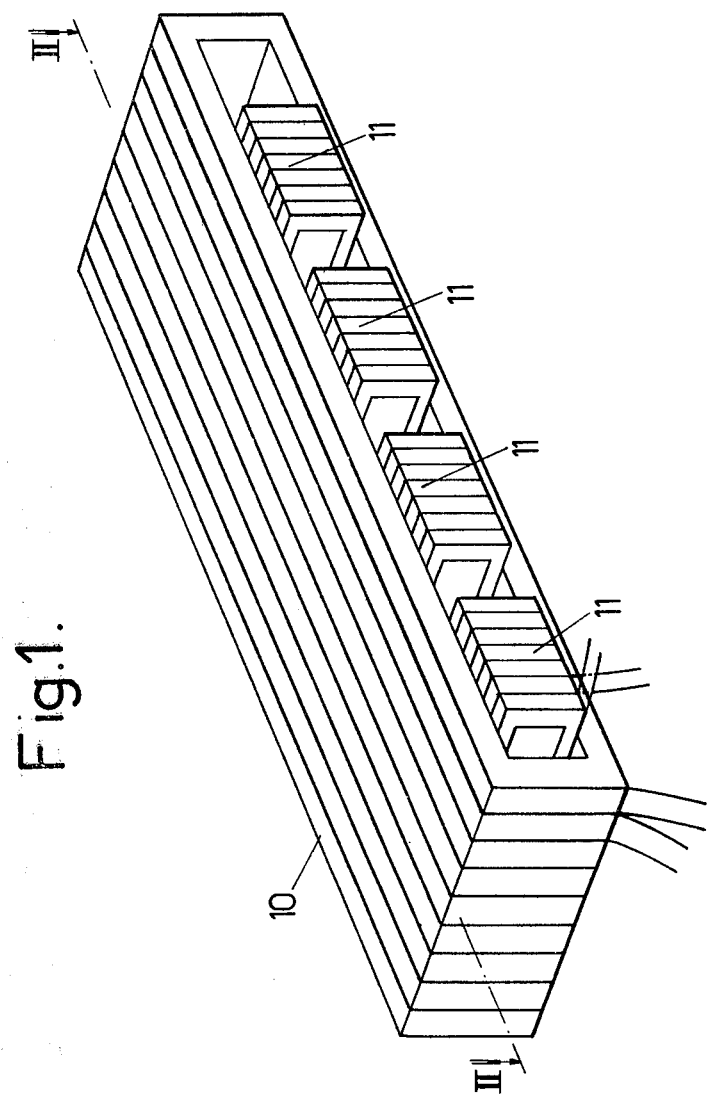
FIG. 1 is an isometric view, showing the distribution of the coils forming the drive means of a memory device comprising eight chips.

Referring to the drawings (where the scale is not respected for more clarity), there are illustrated memory devices of the rotating magnetic field drive type. The memory device comprises four pairs of chips, the chips of a same pair being placed face to face. The means for creating the drive field comprise one external coil winding 10 and four internal elementary coil windings 11, disposed orthogonally to the external coil 10 and connected in series relation to constitute a fractioned coil. The assembly consisting of the coils and the components accomodated within the coils is located between means for creating a bias field which will be described further on.

Figure 9:
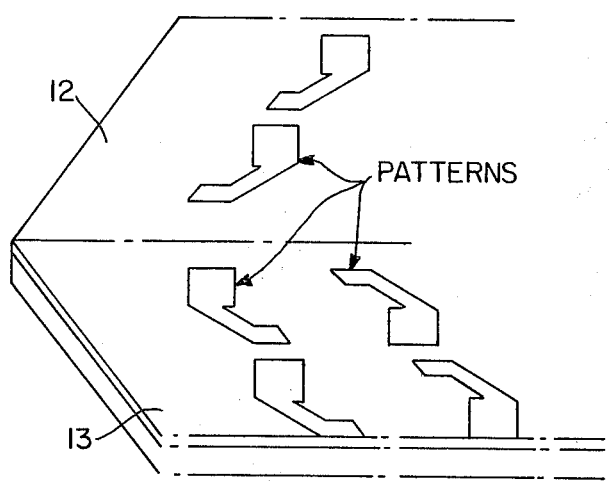
FIG. 9 is an enlarged isometric view indicating a possible shape of the herringbone patterns on the chips of the memory.

Each pair comprises two chips 12 and 13 (FIGS. 2 and 3) each of which is of conventional construction: each chip has a substrate carrying a storage layer of magnetic material, separated by a thin electrically insulating sandwich layer from bubble paths formed by juxtaposition of herringbone or half-moon patterns (see FIG. 9). Since the patterns to be used are of well-known type as well as the connecting means associated thereto, they will not be described here.

Figure 10:
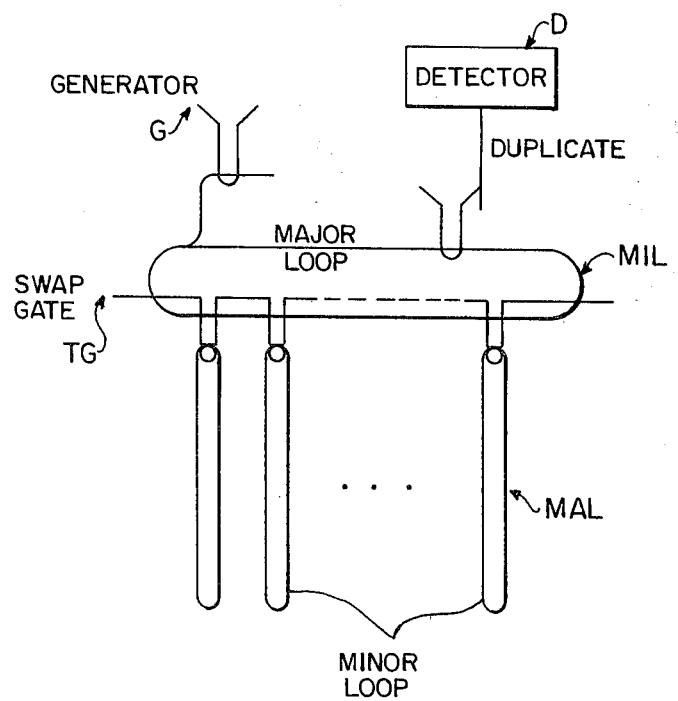
FIG. 10 is a schematic representation of a conventional bubble memory arrangement having a major loop and minor loops.

The patterns are associated with conventional means for creating, duplicating, transferring and sensing bubbles. As shown in FIG. 10, the means for creating bubbles may consist of a generator G associated with a gate for coupling with the major loop MAL. The means for duplicating and sensing bubbles comprise a detector D coupled to the major loop through an associated gate. Transfer of bubbles between the major loop MAL and a minor loop MIL is carried out by a transfer or "swap" gate TG, as indicated in FIG. 10. The magnetic layers of the two facing chips 12 and 13 must be very close to one another, so as not to be appreciably offset from the plane of symmetry of the coils. An advantageous arrangement for such an assembly consists in providing the connecting leads between each chip and its output terminals projecting from the casing on a flexible insulating material film 15, whose thickness is less than a few tenths of a millimeter and typically less than 0.1 mm. The conducting leads 14 may be formed by electrically conducting paths coated on film 15, made from polyimide for example.

Figure 3:
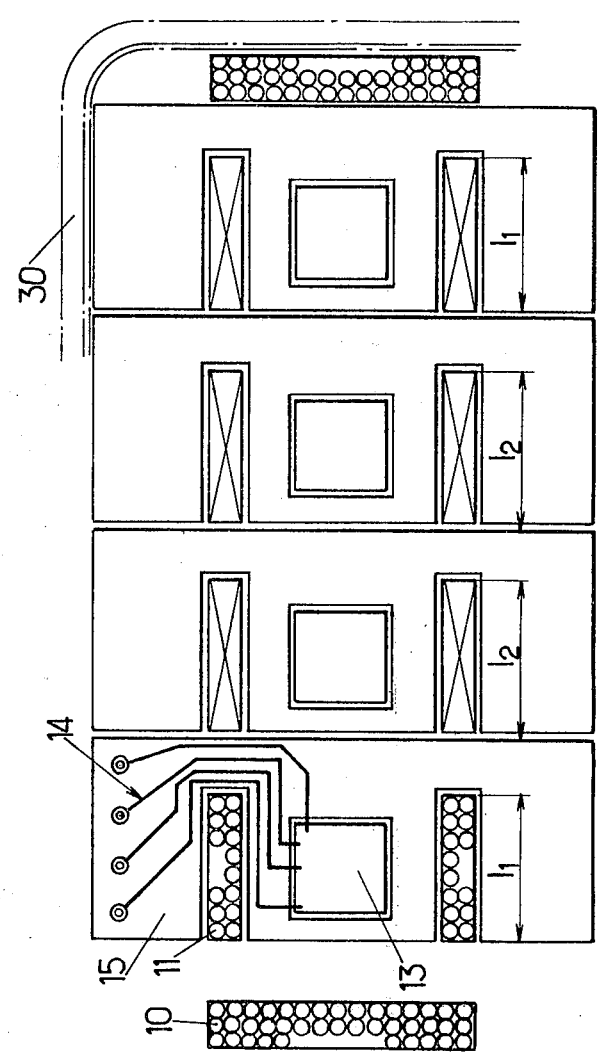
FIG. 3 is a schematic cross-section along line III—III of FIG. 2.

To obtain a satisfactory signal/noise ratio, the length of the connections of each chip must be as short as possible. That result is attained by giving the film an "E" shape which has the additional advantage of easier assembly of the internal coils 11 (FIG. 3).

For satisfactory operation of the chips, it is important that the rotating field be uniform in value in the whole of the effective area of the chips. On the other hand, fractionating the internal coil into four coil windings 11 causes a discontinuity of the magnetic field between the chips. In itself, this discontinuity is not troublesome, but it also tends to cause a loss of homogeneity in zones confronting the chips. To conteract this effect, the internal coils illustrated in FIGS. 2-4 have a number of turns per unit length which is varied along the length. In FIG. 3, the variation of the number of turns has been shown schematically in the form of a reduction of the number of wire layers in the central part of the internal coil 11.

In addition, the two endmost internal coils preferably have a length $l_1$ greater than the length $l_2$ of the central coils for field homogeneity. Similarly, the external coil 10 may preferably have a smaller number of turns per unit length in its central part than in its end parts (FIGS. 3 and 4).

Figure 5:
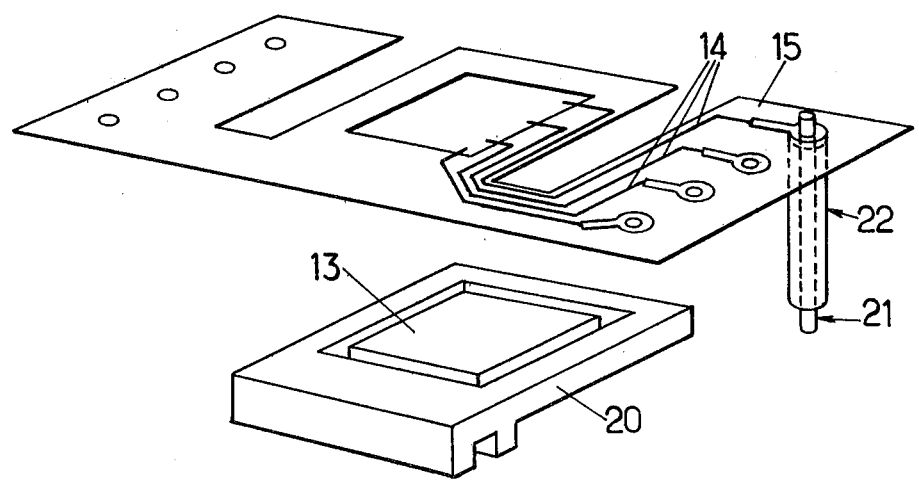
FIG. 5 is an isometric sketch showing a chip support suitable for use in the memory device of FIG. 1, as well as the layout of the output connections.

For accurate positioning of the chips in the internal coils, the latter are advantageously located in a recess provided in a supporting plate 20 of molded insulating material (FIG. 5). The plates are designed and sized to fit into the internal coil windings 11 (FIG. 2) after being assembled by pairs clamping the chips and the flexible film, sandwiched between the chips.

Referring to FIG. 5, output connections 21 are transversal to the plane of the chips and are provided with individual shields 22 avoiding interferences. The output connections may be formed by insulated wires, soldered to end-tags of the leads formed by metal paths. The detection loops of the memories are consequently less subjected to electrical interferences.

Figure 4:
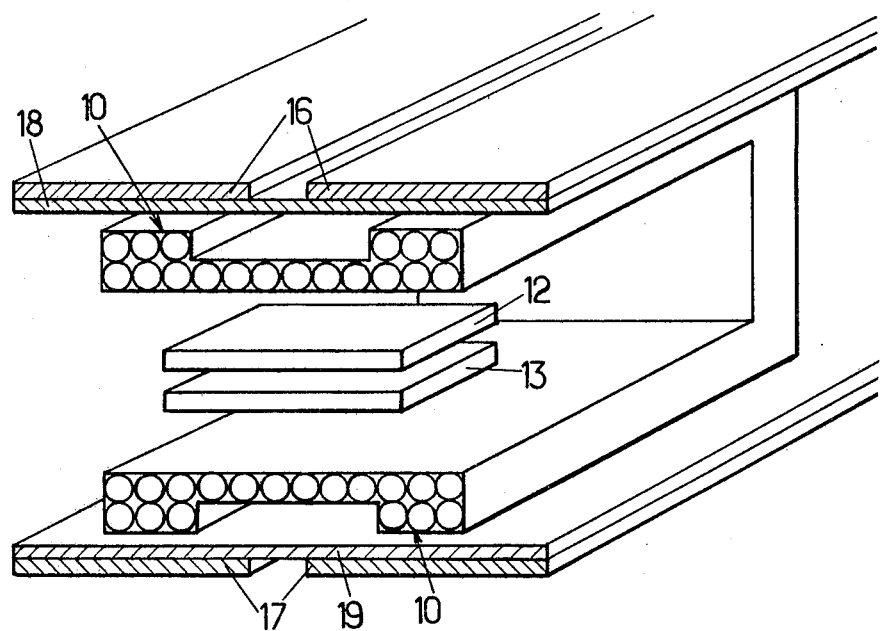
FIG. 4 is an isometric detail view on an enlarged scale, showing the construction of the external coil and the means for creating the bias field.

Referring to FIG. 4, the magnetic bias field is provided by flat permanent magnets 16 and 17. The bias field should be uniform. For that purpose, each permanent magnet 16 or 17 consists of two magnets placed side by side on a same homogenization plate 18 or 19 (FIG. 4) of soft magnetic material. The use of two juxtaposed magnets overcomes the problems associated with the edge effects of the package.

Last, the assembly thus formed may advantageously be slid into a case of soft magnetic material, such as mumetal, forming a return path for the magnetic flux produced by the permanent magnets 16 and 17 which case may in turn be located in an encapsulating casing 30 (see FIG. 3).

Figure 2:
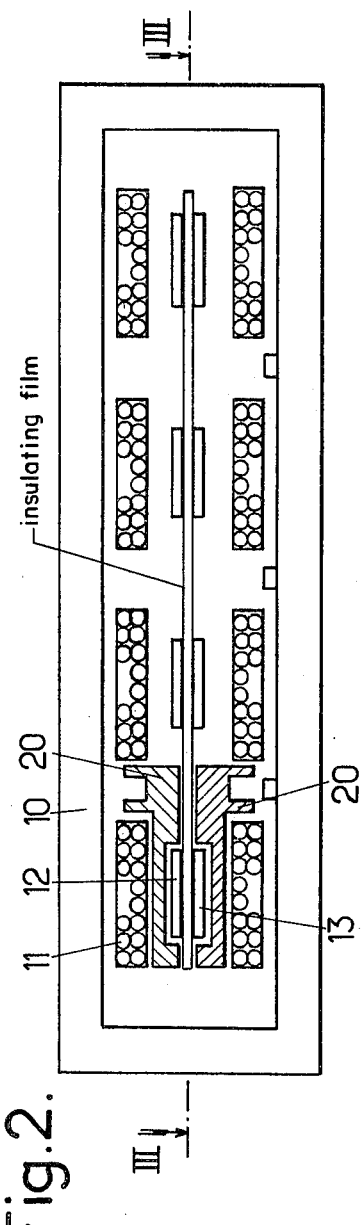
FIG. 2 is a simplified view in cross-section along the median plane II—II of the external coil of FIG. 1.

While the use of individual inner coil windings 11 having a varying number of turns per unit length, as shown in FIGS. 2-4, obviates the consequences of gaps being two inner coils to a considerable extent, there remains local lacks of field homogeneity which are objectionable.

That difficulty is overcome in the embodiments of FIGS. 6 and 7, in which the components corresponding to those illustrated in FIGS. 1-5 are designated with the same reference numerals, to which the indices a and b have been respectively attached.

Referring to FIGS. 6 and 7, there are shown coil arrangements in which there is no axial gap between the inner coil windings. However, a path remains available for the lead connections between adjacent coil windings and consequently all lead connections may have the same length. For that purpose, each individual coil 11a and 11b has a cross-section which is variable along the length thereof. In the embodiment of FIG. 6, each coil winding 11a has a cross-section which is wider in an end portion thereof 24 than in the remaining length 25. There is consequently provided a U shaped path for the lead connections 14a, which projects out of portion 25 axially, then radially, and then axially again between portion 25 and portion 24 of the adjacent coil winding 11a. Film 15a which acts as a lead carrier differs from the carrier illustrated in FIG. 5 in that it includes a projecting portion 26 of reduced width for supporting the portion of the path which is within part 25 of the coil adjacent to that directly associated with the film.

It will be apparent from FIG. 6 that such a construction completely removes the need for an axial gap between adjacent coil windings 11a.

The same object is achieved in the embodiment of FIG. 7 by the use of coil windings 11b whose width progressively and continuously increases from one end to the other. The path of the lead connections 14b may be considered as reverse from that in FIG. 6. The outer coil 10a or 10b may have the same structure as illustrated in FIG. 4.

Figure 8:
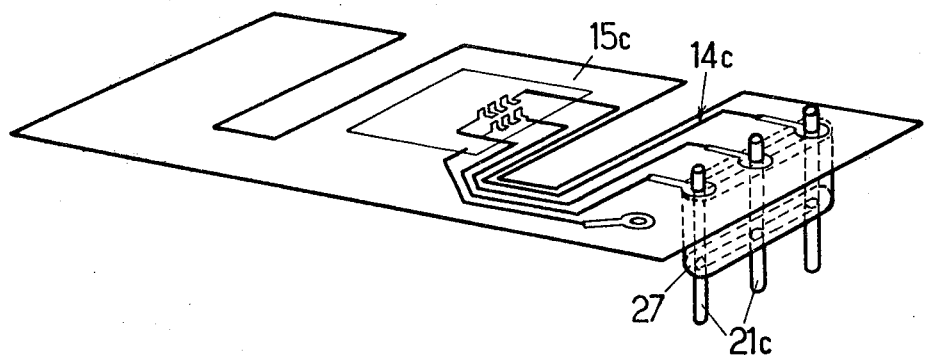
FIG. 8 is a detail view of a modified embodiment having a common shield for the output leads.

Turning again to FIG. 5, each output lead is provided with an individual shield, which is typically in the form of a copper tube having a thickness higher than the "skin" thickness for the operation frequency. While that arrangement is generally satisfactory, there may be circumstances in which differential electromotive forces develop due to eddy currents in the shields. The difficulty is overcome by providing a same electric shield for all outputs, which may be two in number or, as illustrated in FIG. 8, three in number if there is an output connection from the midpoint. Referring to FIG. 8, such a common shield may be provided in the form of a tube 27 of elongated cross-section, surrounding all three pins 21c and insulated therefrom.

Whatever the embodiment which is selected, it results in a magnetic bubble device which is compact in construction, may be implemented in the form of individual memory packages having a storage capacity much higher than the prior art devices, has a low power consumption and a high degree of uniformity between the individual chips.

The invention is not limited to the particular embodiments which have been shown and described by way of example and extends to all modifications which will appear to those familiar with the art.

We claim:

1. A magnetic bubble device, comprising
   a common package,
   at least one pair of memory chips located in said package with bubble propagation patterns in confronting relation,
   means for creating, duplicating, transferring and sensing bubbles,
   connecting means for connection of said means to the outside of said package,
   drive means common to all said chips,
   and bias magnetic field creating means common to all said chips,
   and a thin sheet of electrically insulating material located in a midplane of said drive means between said chips and carrying lead connections between said chips and electrical output pins,
   wherein the two chips of a same pair have bubble propagation patterns which are mirror images of each other and additionally angularly offset by 180°.

2. A device according to claim 1, wherein the bias magnetic field is at an angle of from 1° to 3° with the direction perpendicular to the chips.

3. A device according to claim 1, wherein the device comprises a plurality of said pairs aligned in side by side relation within said package and said bias magnetic field creating means are common to said plurality.

4. A device according to claim 3, wherein said drive means are of the rotating magnetic field type and include:
   a separate inner coil winding associated with each individual said pair and encircling said individual pair, all said inner coil windings being in series relation, and
   a common outer coil winding located transversely of said inner coils and encircling all said inner coils.

5. A device according to claim 4, wherein the lead connections associated to the chips of a same pair are formed to follow a path out of said drive means which is located between the inner coil associated with said pair and the inner coil associated with an adjacent pair of said chips.

6. A device according to claim 4, wherein each said coil winding has a number of conductor turns per unit length which is smaller in the central portion than in the end portions.

7. A device according to claim 4, wherein the inner coil windings associated with internal pairs of said chips are longer than the inner coil windings associated with the two end pairs of said chips.

8. A device according to claim 3, wherein said lead connections have non shielded portions which are located in the midplane of said drive means and bias magnetic field creating means and are of substantially identical length for all chips.

9. A device according to claim 3 or 8, wherein said drive means are of the rotating magnetic field type and include:
   a first coil coaxial with the direction of alignment of said pairs, comprising separate inner coil windings each associated with a separate one of said pairs and encircling said individual pair, having a cross-section varying from one end to the other of said inner coil winding, and
   a common second coil winding located transversely of said first coil and encircling all said inner coil windings.

10. A device according to claim 9, wherein each said coil winding has an end portion whose cross-section has a width greater than the width of the balance of the remainder of said coil winding and there is no axial gap between adjacent windings.

11. A device according to claim 9, wherein each said coil winding has a cross-section whose width progressively increases from one end to the other of said coil winding and there is no axial gap between adjacent windings.

12. A device according to claim 8, wherein those parts of the output electrical connections of said package which are transverse to said chips are surrounded by shield means between said film and an encapsulating casing.

* * * * *